(12) United States Patent
Ikeda et al.

(10) Patent No.: US 10,784,885 B2
(45) Date of Patent: Sep. 22, 2020

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Takayuki Ikeda, Atsugi (JP); Seiichi Yoneda, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/623,588

(22) PCT Filed: Jun. 13, 2018

(86) PCT No.: PCT/IB2018/054278
§ 371 (c)(1),
(2) Date: Dec. 17, 2019

(87) PCT Pub. No.: WO2019/003014
PCT Pub. Date: Jan. 3, 2019

(65) Prior Publication Data
US 2020/0112320 A1  Apr. 9, 2020

(30) Foreign Application Priority Data

Jun. 26, 2017 (JP) ................................ 2017-124095

(51) Int. Cl.
*H03M 1/66* (2006.01)
*G11C 7/16* (2006.01)
(Continued)

(52) U.S. Cl.
CPC .............. *H03M 1/662* (2013.01); *G11C 7/16* (2013.01); *G11C 11/56* (2013.01); *H03K 3/037* (2013.01);
(Continued)

(58) Field of Classification Search
CPC ...... H03M 1/66; G11C 11/401; G11C 7/1057; G11C 7/1036
(Continued)

(56) References Cited

U.S. PATENT DOCUMENTS 8,964,489 B2   2/2015  Saito
9,349,454 B2   5/2016  Ikeda et al.
(Continued)

FOREIGN PATENT DOCUMENTS

DE   102016211033    12/2016
JP   2002-319300 A   10/2002
(Continued)

OTHER PUBLICATIONS

International Search Report (Application No. PCT/IB2018/054278) dated Sep. 18, 2018.

(Continued)

*Primary Examiner* — Joseph J Lauture
(74) *Attorney, Agent, or Firm* — Robinson Intellectual Property Law Office; Eric J. Robinson

(57) ABSTRACT

A semiconductor device in which an increase of circuit area is prevented is provided. A semiconductor device including a control circuit with a plurality of scan chain circuits, a DA converter electrically connected to the control circuit, and a plurality of potential holding units electrically connected to the DA converter is provided. The plurality of potential holding units each include a transistor including an oxide semiconductor in a channel formation region and a capacitor electrically connected to the transistor. In accordance with digital data held in any one of the plurality of scan chain circuits, an output potential output from the DA converter is held in any one of the plurality of potential holding units.

14 Claims, 16 Drawing Sheets

(51) Int. Cl.
*G11C 11/56* (2006.01)
*H03K 3/037* (2006.01)
*G11C 11/401* (2006.01)
*G11C 7/10* (2006.01)

(52) U.S. Cl.
CPC .......... *G11C 7/1036* (2013.01); *G11C 7/1057* (2013.01); *G11C 11/401* (2013.01); *H03M 1/66* (2013.01)

(58) Field of Classification Search
USPC ................. 341/144; 365/149, 189.5, 189.12, 365/189.01; 257/57, 66, 67, 69
See application file for complete search history.

(56) References Cited

U.S. PATENT DOCUMENTS

| | | | |
|---|---|---|---|
| 9,444,337 | B2 | 9/2016 | Takahashi |
| 10,002,656 | B2 | 6/2018 | Ikeda et al. |
| 2010/0265754 | A1 | 10/2010 | Saito |
| 2015/0255157 | A1 | 9/2015 | Ikeda et al. |
| 2016/0240239 | A1 | 8/2016 | Ikeda et al. |
| 2016/0379564 | A1 | 12/2016 | Inoue et al. |
| 2019/0348011 | A1* | 11/2019 | Kurokawa ............... G06N 3/08 |

FOREIGN PATENT DOCUMENTS

| | | |
|---|---|---|
| JP | 2004-037254 A | 2/2004 |
| JP | 2010-267368 A | 11/2010 |
| JP | 2014-011260 A | 1/2014 |
| JP | 2015-181081 A | 10/2015 |
| JP | 2017-011704 A | 1/2017 |
| KR | 2015-0105214 A | 9/2015 |
| KR | 2017-0001613 A | 1/2017 |
| TW | 201543805 | 11/2015 |

OTHER PUBLICATIONS

Written Opinion (Application No. PCT/IB2018/054278) dated Sep. 18, 2018.

* cited by examiner

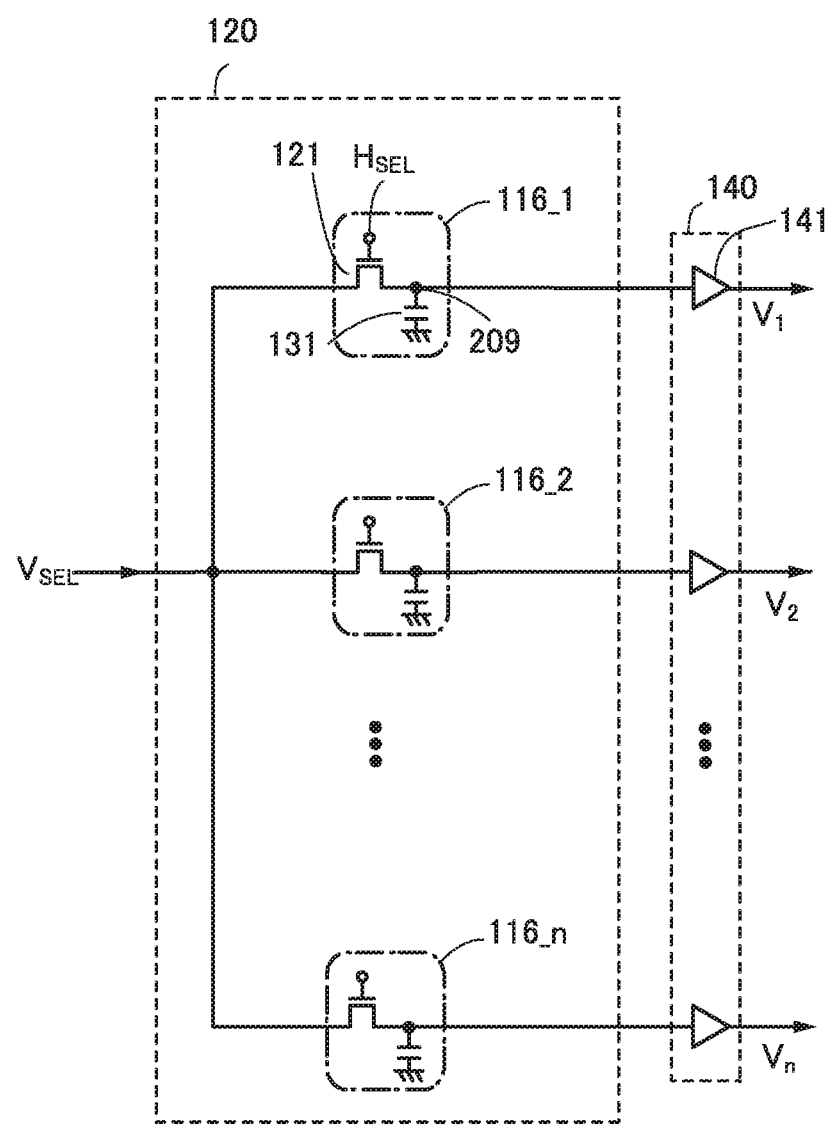

SEMICONDUCTOR DEVICE AND ELECTRONIC DEVICE

TECHNICAL FIELD

One embodiment of the present invention relates to a semiconductor device.

BACKGROUND ART

Power supply circuits with a variety of configurations have been proposed. For example, a power supply circuit with a configuration in which a memory, a decoder circuit, a timing control circuit, a DAC (Digital to Analog Converter), and a regulator circuit are provided is proposed (see FIG. 11 of Patent Document 1). The DA converter generates multiple kinds of potentials in accordance with the control data output from the memory, and the multiple kinds of potentials are output via switches to the outside.

REFERENCE

Patent Document

[Patent Document 1] Japanese Published Patent Application No. 2014-11260

SUMMARY OF THE INVENTION

Problems to be Solved by the Invention

Power supply circuits that output multiple kinds of potentials are used for a variety of purposes, such as reading out data of a multilevel memory, for example. It is preferable that potentials to be used for reading be more kinds of potentials than the number of bits stored in a multilevel memory; for example, a power supply circuit that outputs 4-bit (16 kinds of) potentials is preferably used for reading a multilevel memory that stores 2-bit data. In addition, a power supply circuit that outputs 10-bit (1024 kinds of) potentials is preferably used for reading a multilevel memory that stores 4-bit data. This is for the purpose of reading out data more accurately with the use of multiple kinds of potentials with potential widths varying in small steps.

The use of such power supply circuits enables more accurate data reading; however, the number of elements included in a selection circuit for selecting the multiple kinds of potentials increases and the circuit area of the selection circuit in the power supply circuit becomes large.

In view of the above problems, an object of one embodiment of the present invention is to provide a semiconductor device in which an increase in circuit area is prevented.

Means for Solving the Problems

One embodiment of the present invention includes a control circuit including a plurality of scan chain circuits, a DA converter electrically connected to the control circuit, and a plurality of potential holding units electrically connected to the DA converter. The plurality of potential holding units each include a transistor including an oxide semiconductor in a channel formation region and a capacitor electrically connected to the transistor. An output potential output from the DA converter is held in any one of the plurality of potential holding units, in accordance with digital data held in any one of the plurality of scan chain circuits.

In one embodiment of the present invention, a configuration in which the plurality of scan chain circuits each include a flip-flop circuit is preferable. Furthermore, in one embodiment of the present invention, a configuration in which one of a source and a drain of the transistor is electrically connected to one electrode of the capacitor and the other of the source and the drain of the transistor is electrically connected to the DA converter is preferable.

In one embodiment of the present invention, a configuration in which the output potential output from the DA converter is held in a node where one of a source and a drain of the transistor is connected to one electrode of the capacitor is preferable. Furthermore, in one embodiment of the present invention, a configuration in which the transistor includes a gate electrode and a back gate electrode is preferable.

In one embodiment of the present invention, a configuration including a monitor circuit electrically connected to any one of the plurality of potential holding units and including a resistor is preferable. A configuration in which the monitor circuit supplies to the control circuit data on an amount of current flowing through the resistor is preferable.

Effects of the Invention

According to one embodiment of the present invention, a semiconductor device in which an increase in circuit area is prevented can be provided.

BRIEF DESCRIPTION OF THE DRAWINGS

FIG. 4 A diagram illustrating a configuration of a semiconductor device of one embodiment of the present invention.

MODES FOR CARRYING OUT THE INVENTION

Figure 1:
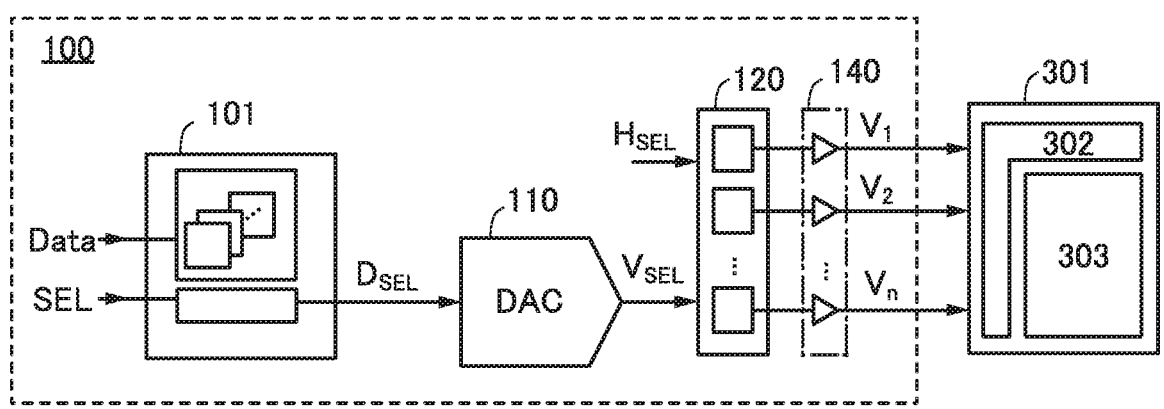
FIG. 1 A diagram illustrating a configuration of a semiconductor device of one embodiment of the present invention.

Embodiments will be described below with reference to drawings. However, the embodiments can be implemented in many different modes, and it will be readily appreciated by those skilled in the art that modes and details thereof can be changed in various ways without departing from the spirit and scope thereof. Thus, one embodiment of the present invention should not be interpreted as being limited to the following description of the embodiments. A plurality of embodiments described below can be combined as appropriate.

Note that ordinal numbers such as "first," "second," and "third" in this specification and the like are used in order to avoid confusion among components. Thus, the ordinal numbers do not limit the number of components. The ordinal numbers do not limit the order of components either.

Note that in the drawings, the same elements, elements having similar functions, elements formed of the same material, elements formed at the same time, or the like are sometimes denoted by the same reference numerals, and repeated description thereof is omitted in some cases.

Embodiment 1

The configuration of a semiconductor device of one embodiment of the present invention will be described with reference to FIG. 1 to FIGS. 5A-5B. In this embodiment, a power supply circuit 100, which outputs n kinds (n is an integer greater than or equal to 2) of potentials through wirings V1 to Vn, will be described.

Note that in this specification and the like, a semiconductor device generally means a device that can function by utilizing semiconductor characteristics. Thus, power supply circuits described in this specification and the like are semiconductor devices.

<Power Supply Circuit 100>

The power supply circuit 100 includes a control circuit 101, a DAC 110, a potential holding circuit 120, and a buffer 140 (see FIG. 1). The control circuit 101 holds digital data (Data) supplied from the outside, and outputs digital data ($D_{SEL}$) it holds to the DAC 110, based on control data (SEL) supplied from the outside. The DAC 110 converts the input digital data ($D_{SEL}$) into analog data, and outputs the analog data ($V_{SEL}$, also referred to as output potential) obtained by the conversion to the potential holding circuit 120. The potential holding circuit 120 holds the analog data ($V_{SEL}$) based on control data ($H_{SEL}$), and outputs the analog data ($V_{SEL}$) via the buffer 140 to an external circuit.

FIG. 1 illustrates the case where a multilevel memory 301 is used as the external circuit. The multilevel memory 301 includes a memory cell array 303 including a plurality of memory cells that hold data, and a circuit 302 that drives the memory cell array 303. Various potentials generated by the power supply circuit 100 are used for the operations of the memory cell array 303 and the circuit 302.

<Control Circuit 101>

Figure 2A:
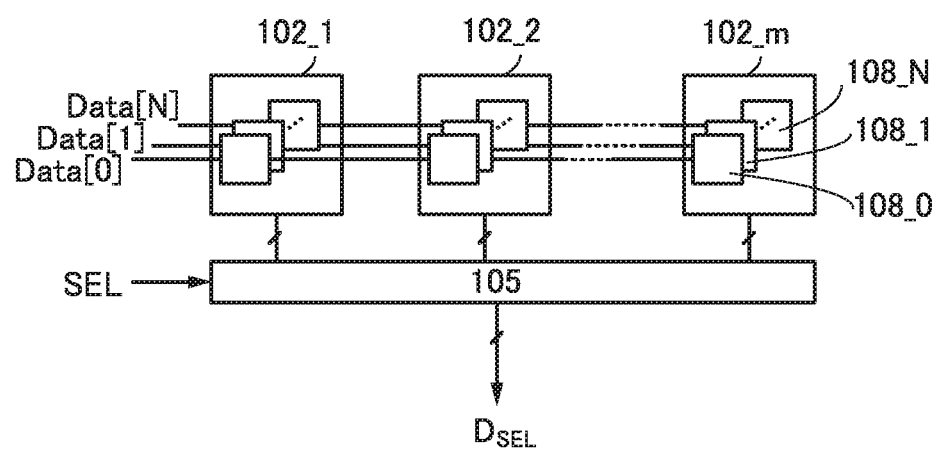
FIGS. 2A-2B Diagrams illustrating a configuration of a semiconductor device of one embodiment of the present invention.

The control circuit 101 includes a plurality of scan chain circuits 102_1 to 102_m (m is an integer greater than or equal to 2) and a selection circuit 105 (see FIG. 2A).

The scan chain circuits 102_1 to 102_m are circuits that hold digital data (Data[0] to [N], N is an integer greater than or equal to 1) input from the outside, and include a flip-flop circuit and the like. The number of flip-flop circuits is not particularly limited; however, one flip-flop circuit is preferably provided per bit. FIG. 2A illustrates the case where the scan chain circuits 102_1 to 102_m each include (N+1) flip-flop circuits 108_0 to 108_N.

Note that digital data (Data [0] to [N]) may be referred to as data corresponding to parameters.

Figure 2B:
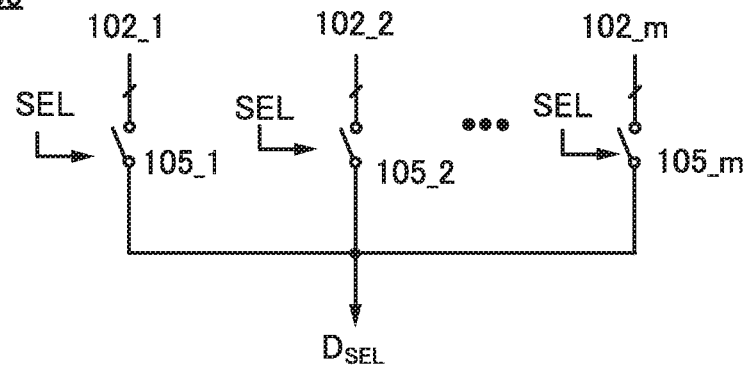

The selection circuit 105 includes switches 105_1 to 105_m (see FIG. 2B). The switches 105_1 to 105_m are circuits whose on/off state is controlled in accordance with the control data (SEL) input from the outside, and include a transistor or the like. Note that an example in which switches are used as the selection circuit 105 is described in this embodiment; however, this example is not necessarily employed, and decoders or the like may be used.

<DAC 110>

Figure 3A:
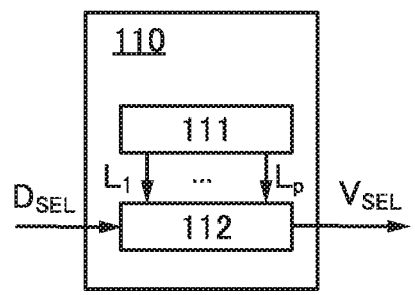
FIGS. 3A-3C Diagrams illustrating a configuration of a semiconductor device of one embodiment of the present invention.

The DAC 110 includes a potential generating circuit 111 that generates multiple kinds of potentials, a selection circuit 112, and a plurality of wirings L1 to Lp (p is an integer greater than or equal 2) (see FIG. 3A).

Figure 3B:
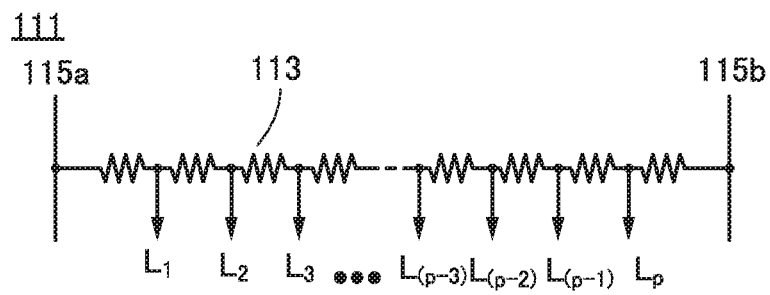

The potential generating circuit 111 includes a plurality of resistors 113 (see FIG. 3B). The plurality of resistors 113 are connected in series, one end of which is connected to a wiring 115a, and the other end of which is connected to a wiring 115b. Between the wiring 115a and the wiring 115b exists a potential difference, and the potential difference is divided with the plurality of resistors 113. The divided multiple kinds of potentials are transmitted to the wirings L1 to Lp.

Note that an example in which a resistor string type is used for the potential generating circuit 111 is described in this embodiment; however, the configuration is not limited thereto and a resistor ladder type, a capacitor array type, a weighted resistor type, or the like may be used. In accordance with the type, resistors, capacitors, operational amplifiers, or the like are provided.

Figure 3C:
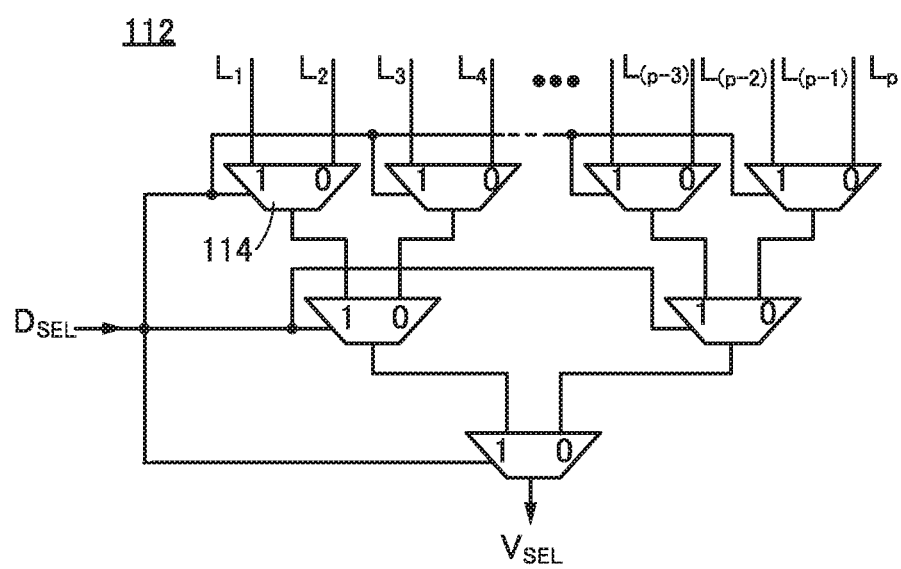

The selection circuit 112 includes a plurality of selectors 114 connected in a tournament-like way (see FIG. 3C). Based on the control data ($D_{SEL}$) input from the outside, any one of potentials from the plurality of wirings L1 to Lp is output as an output potential ($V_{SEL}$) to the potential holding circuit 120.

Note that the case in which the plurality of selectors 114 are provided in three separate stages is shown in FIG. 3C; however, one embodiment of the present invention is not limited to this configuration. Furthermore, although an example in which the selectors 114 are used as the selection circuit 112 is shown, this example is not necessarily employed and decoders or the like may be used.

<Potential-Holding Circuit 120>

The potential holding circuit 120 includes a plurality of potentials holding units 116_1 to 116_n (see FIG. 4). The potentials hold units 116_1 to 116_n each have a function of holding an analog potential, and include a transistor 121 and a capacitor 131. One of a source and a drain of the transistor 121 is connected to the DAC 110. The other of the source and the drain of the transistor 121 is connected to one electrode of the capacitor 131. The other electrode of the capacitor 131 is connected to a wiring which is kept at a constant potential. The point where the other of the source and the drain of the transistor 121 is connected to the capacitor 131 is referred to as a node 209.

Control data ($H_{SEL}$) is input to a gate of the transistor 121 to control the on/off state of the transistor 121. Note that the transistor 121 preferably uses an oxide semiconductor in its channel formation region. A transistor using an oxide semiconductor has an extremely low off-state current. Thus, the transistor 121 being kept in an off-state after the output potential ($V_{SEL}$) is held at the node 209 enables the potential of the node 209 to be held for a long time. The oxide semiconductor contains at least one of In, Ga, and Zn.

Figure 5A:
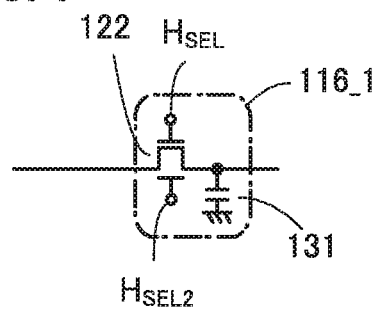
FIGS. 5A-5B Diagrams each illustrating a configuration of a semiconductor device of one embodiment of the present invention.

Note that an example in which a single-gate transistor is used as the transistor 121 is shown in FIG. 4; however, this example is not necessarily employed and a transistor 122 with a back gate electrode may be used (see FIG. 5A). Control data ($H_{SEL2}$) is supplied to the back gate electrode of the transistor 122 to control the threshold voltage of the transistor 122 itself. Alternatively, a transistor 123 whose back gate electrode and front gate electrode are connected to each other may be used (see FIG. 5B).

Figure 5B:
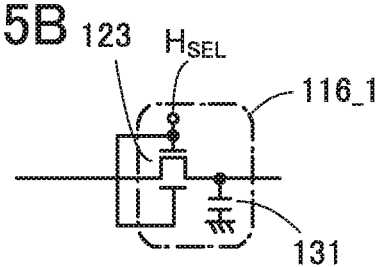

Note that although FIGS. 5A-5B illustrates only the potential holding unit 116_1 in the first row, the potential holding units 116_2 to 116_n in the second row to the n-th row can also be provided with the transistors 122 and 123 with back gate electrodes. The configurations of the transistors included in the plurality of potential holding units 116_1 to 116_n need not be all the same; free combinations of the single-gate transistor 121 and the transistors 122 and 123 with back gate electrodes can be used.

<Buffer 140>

The buffer 140 includes a plurality of amplifiers 141 (see FIG. 4). The plurality of amplifiers 141 are respectively connected to the wirings V1 to Vn. Note that the buffer 140 is not a requisite component, and may be omitted if unnecessary.

As described above, in one embodiment of the present invention, selection of multiple kinds of potentials is possible as a function of a semiconductor device functioning as a power supply circuit, without an increase in the number of elements included in a selection circuit. Thus, the area of the selection circuit in the semiconductor device can be reduced.

Embodiment 2

Figure 16:
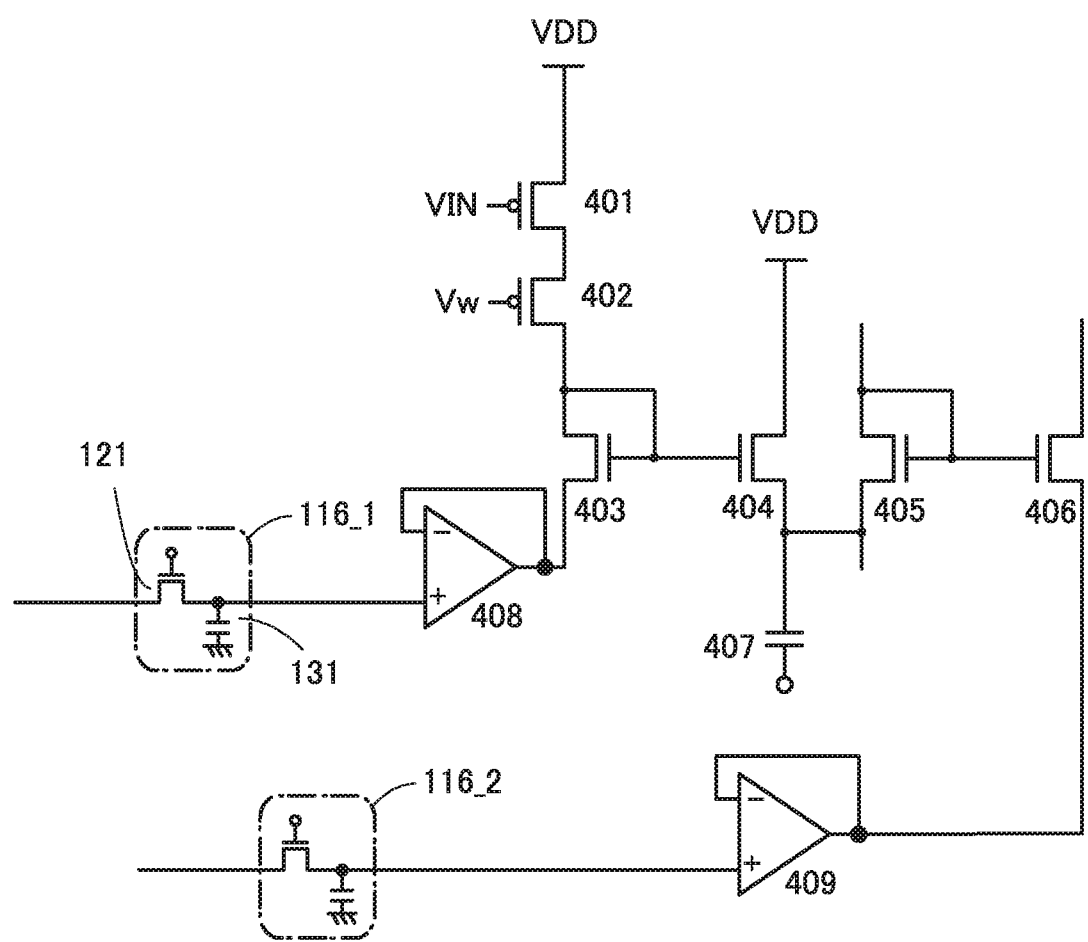
FIG. 16 A diagram illustrating a configuration of a semiconductor device of one embodiment of the present invention.

In this embodiment, variations of destinations to which the potential holding units 116_1 to 116_n are connected is described with reference to FIGS. 6A-6C, 7A-7B, and 16. Although FIGS. 6A-6C and 7A-7B only show the potential holding unit 116_1 in the first column and FIG. 16 shows the potential holding units 116_1 and 116_2 in the first column and second column, the configurations shown in FIGS. 6A-6C, 7A-7B, and 16 can also be used for the potential holding units in the other columns.

Figure 6A:
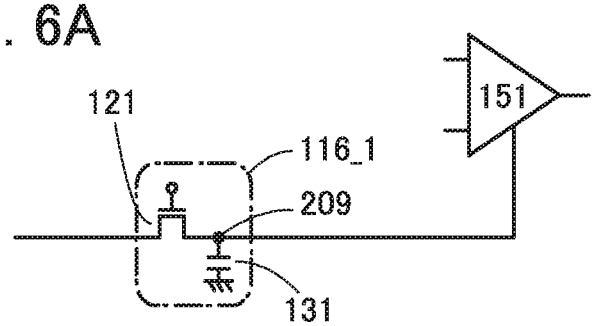
FIGS. 6A-6C Diagrams each illustrating a configuration of a semiconductor device of one embodiment of the present invention.

The node 209 of the potential holding unit 116_1 may be connected to an operational amplifier 151 (see FIG. 6A). The operational amplifier 151 includes a plurality of terminals; the node 209 is preferably connected to a terminal for bias potential. Since the terminal for bias potential normally does not consume steady-state current, the node 209 of the potential holding unit 116_1 can be directly connected to the terminal.

Figure 6B:
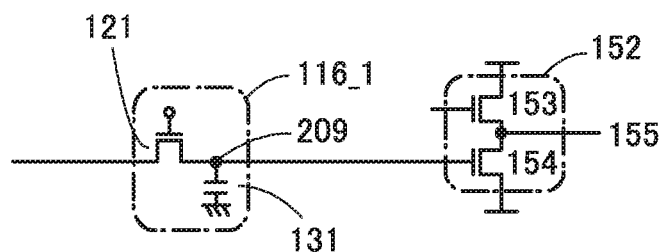
Figure 6C:
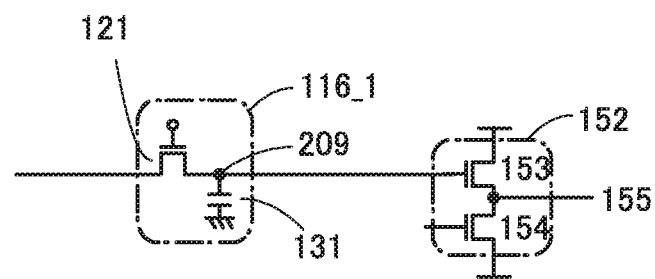

Furthermore, the node 209 of the potential holding unit 116_1 may be connected to a source follower circuit 152 (see FIGS. 6B and 6C). The source follower circuit 152 includes an n-channel transistor 153 and an n-channel transistor 154. The node 209 of the potential holding unit 116_1 is connected to a gate of the n-channel transistor 154 (see FIG. 6B) or a gate of the n-channel transistor 153 (see FIG. 6C). In FIG. 6B, the potential of the node 209 is used as a bias potential of the source follower circuit 152. In FIG. 6C, the source follower circuit 152 functions as an amplifier of the supplied potential. With such a configuration, connecting a terminal 155 to a supply destination that allows steady-state current to flow enables a potential to be supplied to the supply destination.

Figure 7A:
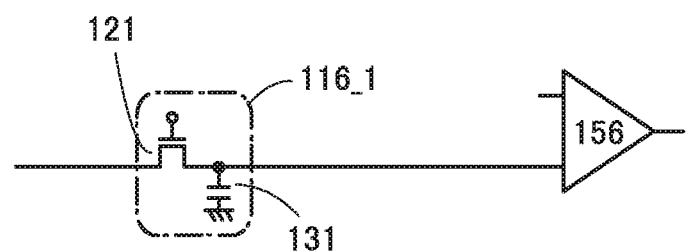
FIGS. 7A-7B Diagrams each illustrating a configuration of a semiconductor device of one embodiment of the present invention.

Furthermore, the node 209 of the potential holding unit 116_1 may be connected to a comparator 156 (see FIG. 7A). The comparator 156 includes a plurality of terminals; the node 209 is preferably connected to a terminal for reference potential. Since the terminal for reference potential normally does not consume steady-state current, the node 209 of the potential holding unit 116_1 can be directly connected to the terminal, in the case where the comparator 156 is made up of a CMOS circuit.

Figure 7B:
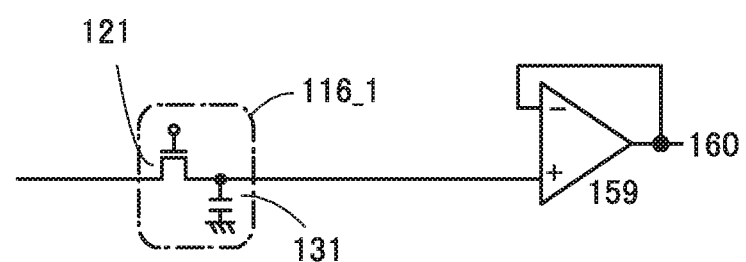

Furthermore, the node 209 of the potential holding unit 116_1 may be connected to a voltage follower 159 (see FIG. 7B). The node 209 of the potential holding unit 116_1 is connected to a terminal for a bias potential of the voltage follower 159. With such a structure, connecting a terminal 160 to a supply destination that allows steady-state current to flow enables a potential to be supplied to the supply destination.

Furthermore, the node 209 of the potential holding unit 116_1 may be connected to an analog AI circuit (see FIG. 16). The analog AI circuit includes transistors 401 to 406 and a capacitor 407, and is a circuit called "tau cell" which imitates part of the function of nerves. The potential of the node 209 of the potential holding unit 116_1 is supplied to one of a source and a drain of the transistor 403 via a voltage follower 408, and the potential of the node 209 of the potential holding unit 116_2 is supplied to one of a source and a drain of the transistor 406 via a voltage follower 409.

The structure described in this embodiment can be used in appropriate combination with the structures described in the other embodiments.

Embodiment 3

In this embodiment, a power supply circuit that outputs 4-bit (16 kinds of) potentials, which is used for reading of a multilevel memory that stores 2-bit data, is taken as an example and the operation of the power supply circuit will be described.

Figure 8A:
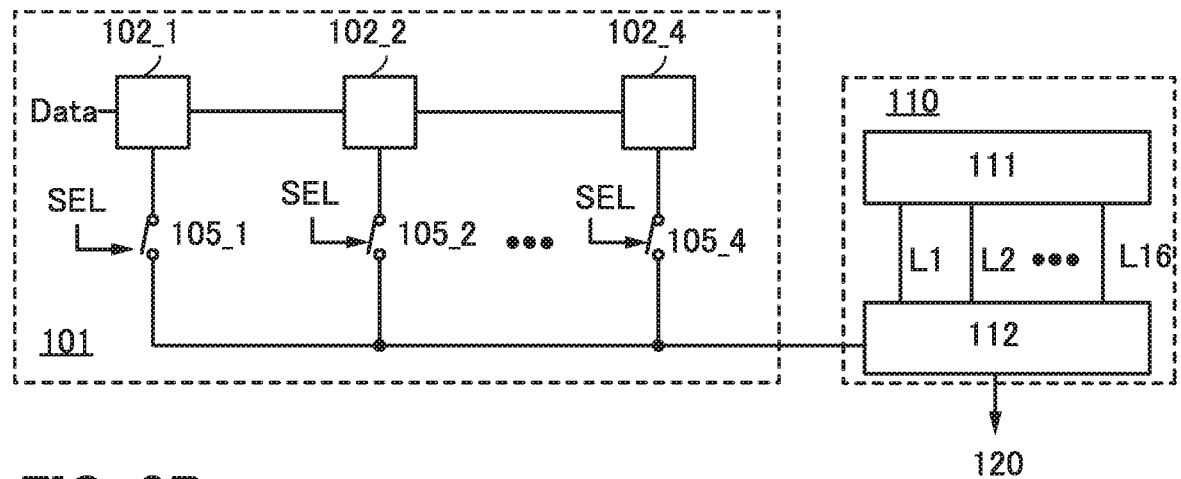
FIGS. 8A-8B Diagrams illustrating a configuration of a semiconductor device of one embodiment of the present invention.
Figure 8B:
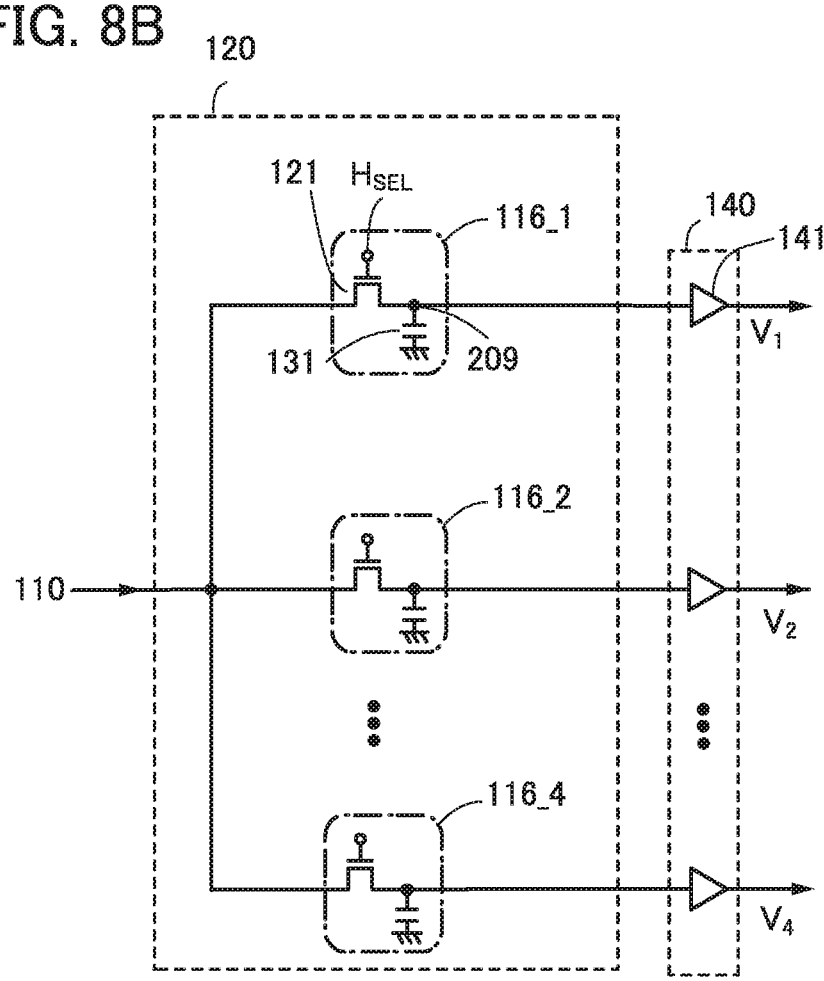

First, the power supply circuit 100 used in description of this embodiment will be described with reference to FIGS. 8A-8B. The control circuit 101 includes four scan chain circuits 102_1 to 102_4 and four switches 105_1 to 105_4 (see FIG. 8A). The DAC 110 includes the potential generating circuit 111 which generates 16 kinds of potentials, the selection circuit 112, and the wirings L1 to L16 (see FIG. 8A). The potential holding circuit 120 includes four potential holding units 116_1 to 116_4 (see FIG. 8B).

Next, the relationship between data held in the scan chain circuits 102_1 to 102_4 and output potential of the DAC 110 is described with reference to Table 1. In Table 1, 16 kinds of digital data that can be held in the scan chain circuits 102_1 to 102_4 and potentials Va1 to Va16 output from the DAC 110. The 16 kinds of potentials Va1 to Va16 respectively correspond to 16 kinds of digital data, and also correspond to the potentials of the wirings L1 to L16.

TABLE 1

| Digital data held in scan chain circuit | At the time of initializing operation | At the time of rewriting | Output potential of DAC 110 |
|---|---|---|---|
| 1111 | | | Va16 |
| 1110 | | 102_4 | Va15 |
| 1101 | | | Va14 |
| 1100 | 102_4 | | Va13 |
| 1011 | | | Va12 |
| 1010 | | 102_3 | Va11 |
| 1001 | | | Va10 |
| 1000 | 102_3 | | Va9 |
| 0111 | | | Va8 |
| 0110 | | 102_2 | Va7 |
| 0101 | | | Va6 |
| 0100 | 102_2 | | Va5 |
| 0011 | | | Va4 |
| 0010 | | 102_1 | Va3 |
| 0001 | | | Va2 |
| 0000 | 102_1 | | Va1 |

<Initializing Operation>

Figure 9:
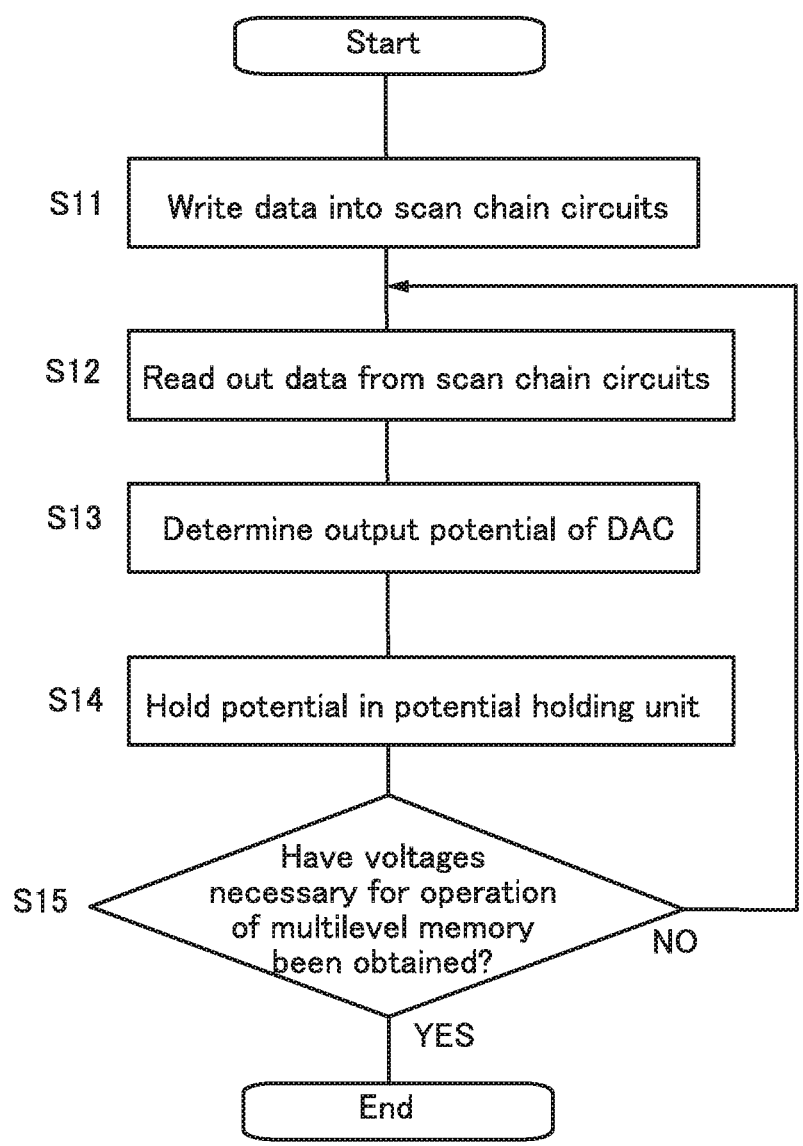
FIG. 9 A diagram illustrating a structure of a semiconductor device of one embodiment of the present invention.

The initializing operation will be described with reference to a flow chart in FIG. 9. In Step S11, digital data is written into each of the scan chain circuits 102_1 to 102_4. In this embodiment, digital data "0000", "0100", "1000", and "1100" are respectively written into the scan chain circuits 102_1 to 102_4, as shown in Table 1.

In Step S12, digital data is read out from any of the scan chain circuits 102_1 to 102_4. In this embodiment, the switch 105_1 is turned on, and digital data "0000" is read out from the scan chain circuit 102_1.

In Step S13, an output potential is determined based on the digital data in the DAC 110. In this embodiment, the potential Va1 of the wiring L1 is the output potential of the DAC 110, based on the digital data "0000" output from the scan chain circuit 102_1.

In Step S14, the output potential of the DAC 110 is held in any one of the potential holding units 116_1 to 116_4. In this embodiment, the transistor 121 of the potential holding unit 116_1 is turned on, and the potential Va1, which is the output potential of the DAC 110, is held in the node 209 of the potential holding unit 116_1.

In Step S15, whether or not potentials necessary for reading a multilevel memory are obtained is determined. In the case where the potentials are obtained, the operation is terminated, while in the case where the potentials are not obtained, the operation goes to Step S12. In this embodiment, since potential setting for the potential holding units 116_2 to 116_4 is not completed, the operation goes to Step S12, and data reading from the scan chain circuit 102_2 (Step S12, "0100"), determination of the output potential of the DAC 110 (Step S13, Va5), and holding of the potential in the potential holding unit 116_2 (Step S14, Va5) are performed. Then, the operation goes again to Step S12 after Step S15, and data reading from the scan chain circuit 102_3 (Step S12, "1000"), determination of the output potential of the DAC 110 (Step S13, Va9), and holding of the potential in the potential holding unit 116_3 (Step S14, Va9) are performed. Then, the operation goes again to Step S12 after Step S15, and data reading from the scan chain circuit 102_4 (Step S12, "1100"), determination of the output potential of the DAC 110 (Step S13, Va13), and holding of the potential in the potential holding unit 116_4 (Step S14, Va9) are performed. After that, in Step S15, it is determined that the potentials necessary for reading the multilevel memory have been obtained, and the operation is terminated.

Through the above operation, the four kinds of potentials Va1, Va5, Va9, and Va13 are respectively held in the potential holding units 116_1 to 116_4, and these four kinds of potentials are used to read the multilevel memory that stores 2-bit data.

<Rewriting Operation>

Figure 10:
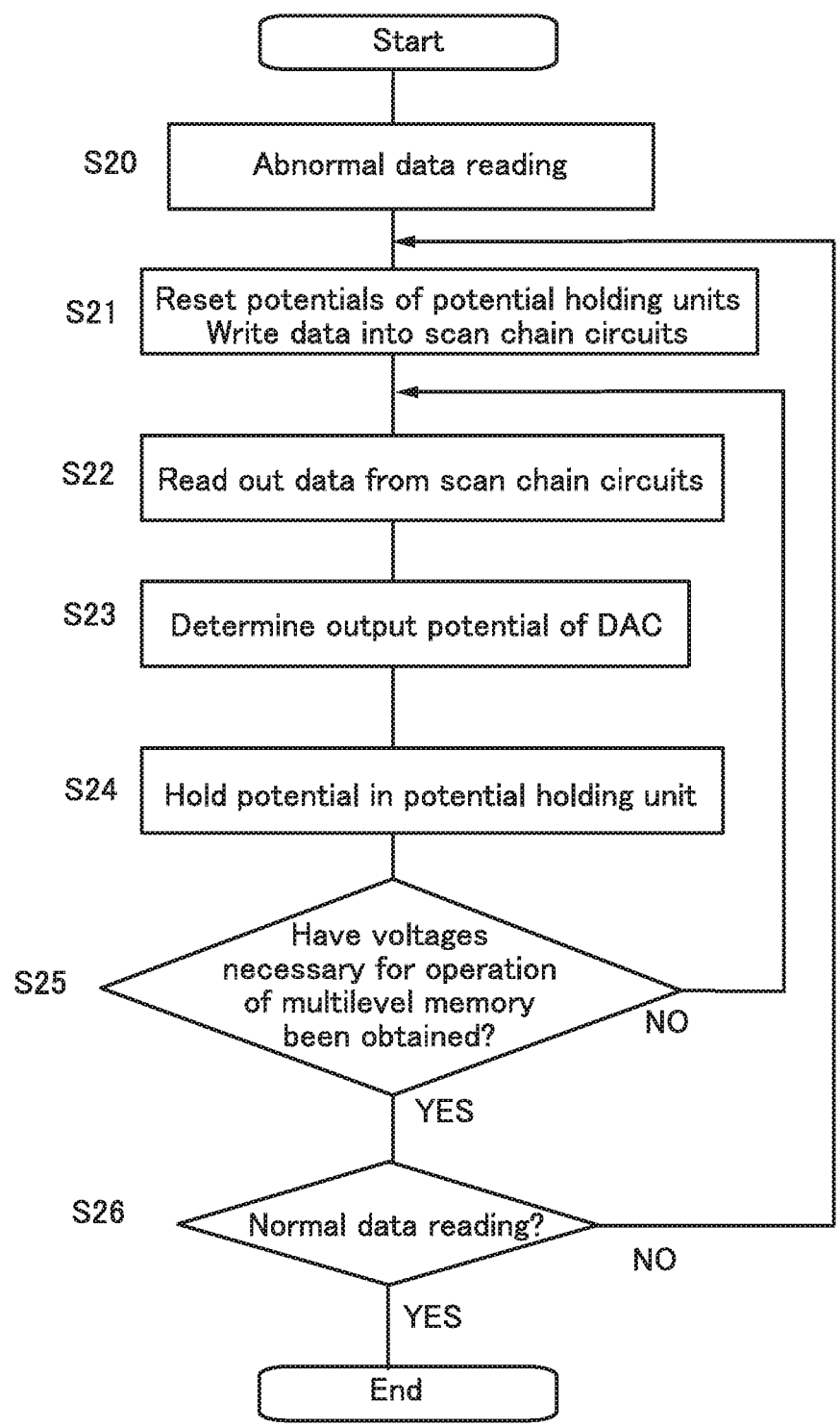
FIG. 10 A diagram illustrating a structure of a semiconductor device of one embodiment of the present invention.
Figure 11:
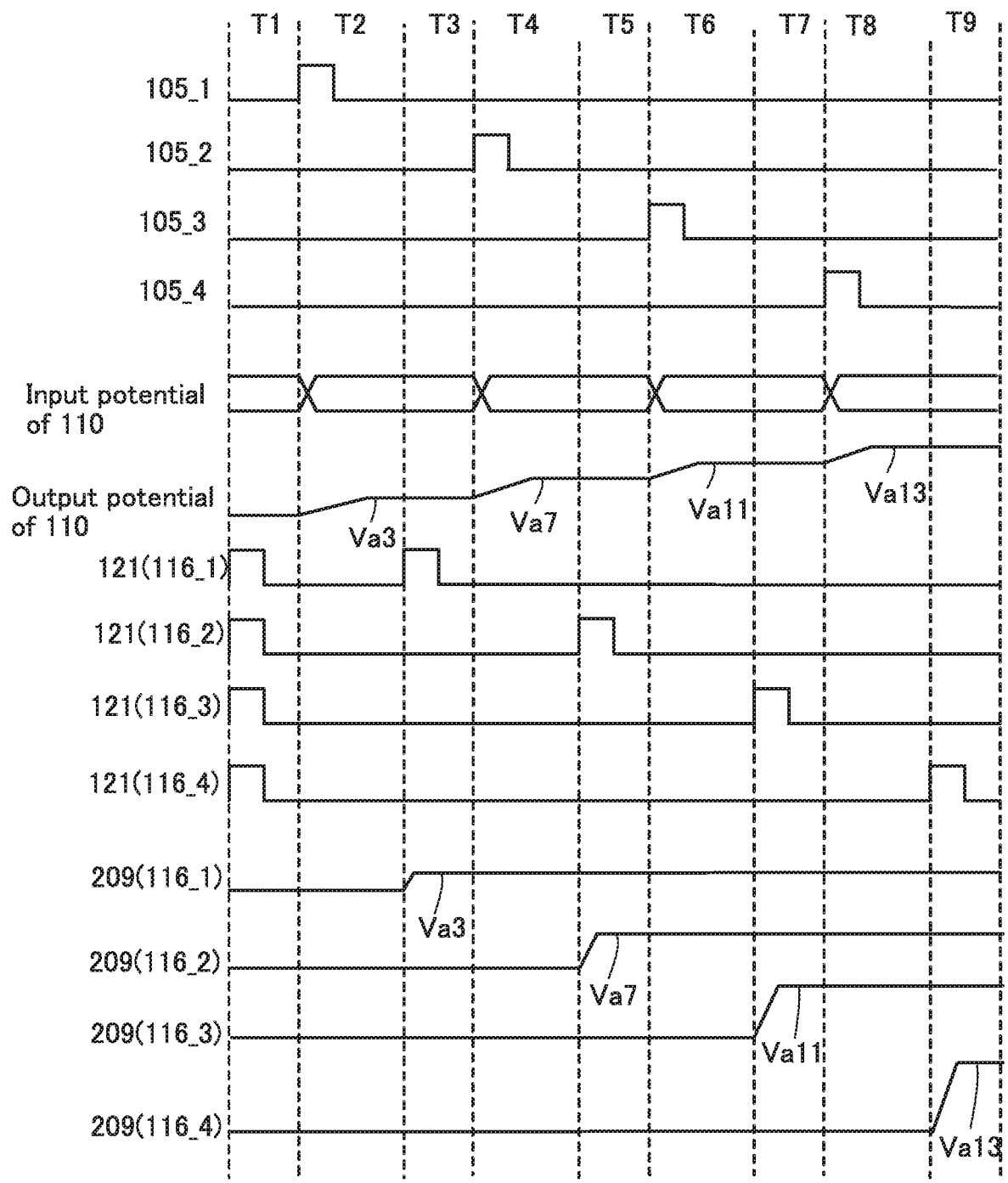
FIG. 11 A diagram illustrating a structure of a semiconductor device of one embodiment of the present invention.

The operation of rewriting the potential held in the potential holding unit will be described with reference to a flow chart in FIG. 10 and a timing chart in FIG. 11. Step S20 is in a state where it is determined that reading of a multilevel memory is not performed normally. Digital data is written into each of the scan chain circuits 102_1 to 102_4 "between Step S20 and Step S21". In this embodiment, digital data "0010", "0110", "1010", and "1110" are respectively written into the scan chain circuits 102_1 to 102_4, as shown in Table 1.

In Step S21 (FIG. 10) and Period T1 (FIG. 11), the potentials of the nodes of the potential holding units that require rewriting are reset. In this embodiment, an H-level signal is supplied to the transistor 121 in each of the potential holding units 116_1 to 116_4, whereby the transistor 121 is turned on and the potential of the node 209 is reset. Then, digital data is written into each of the scan chain circuits 102_1 to 102_4. In this embodiment, digital data "0010", "0110", "1010", and "1110" are respectively written into the scan chain circuits 102_1 to 102_4, as shown in Table 1.

In Step S22 (FIG. 10) and Period T2 (FIG. 11), digital data is read out from any of the scan chain circuits 102_1 to 102_4. In this embodiment, the switch 105_1 is turned on, and digital data "0010" is read out from the scan chain circuit 102_1.

In Step S23 (FIG. 10) and Period T2 (FIG. 11), the output potential is determined in the DAC 110, based on the digital data. In this embodiment, the potential Va3 of the wiring L3 is the output potential of the DAC 110, based on the digital data "0010" output from the scan chain circuit 102_1.

In Step S24 (FIG. 10) and Period T3 (FIG. 11), the output potential is held in any one of the potential holding units 116_1 to 116_4. Here, the transistor 121 of the potential holding unit 116_1 is turned on, and the potential Va3, which is the output potential from the DAC 110, is held in the node 209 of the potential holding unit 116_1.

In Step S25 (FIG. 10), whether or not the potentials necessary for reading the multilevel memory is determined. In the case where the potentials are obtained, the operation goes to Step S26, while in the case where the potentials are not obtained, the operation goes to Step S22.

In this embodiment, since potential rewriting for the potential holding units 116_2 to 116_4 is not completed, the operation goes to Step S22, the switch 105_2 is turned on, and data reading from the scan chain circuit 102_2 (Step S22 (FIG. 10), Period T4 (FIG. 11), "0110"), determination of the output potential of the DAC 110 (Step S23 (FIG. 10), Period T4 (FIG. 11), Va7), and holding of the potential in the potential holding unit 116_2 (Step S24 (FIG. 10), Period T5 (FIG. 11), Va7) are performed. Then, the operation goes again to Step S22 after Step S25, the switch 105_3 is turned on, and data reading from the scan chain circuit 102_3 (Step S22 (FIG. 10), Period T6 (FIG. 11), "1010"), determination of the output potential of the DAC 110 (Step S23 (FIG. 10), Va11), and holding of the potential in the potential holding unit 116_3 (Step S24 (FIG. 10), Period T7 (FIG. 11), Va11) are performed. Then, the operation goes again to Step S22 after Step S25, the switch 105_4 is turned on, and data reading from the scan chain circuit 102_4 (Step S22 (FIG. 10), Period T8 (FIG. 11), "1110"), determination of the output potential of the DAC 110 (Step S23 (FIG. 10), Period T9 (FIG. 11), Va15), and holding of the potential in the potential holding unit 116_4 (Step S24 (FIG. 10), Period T9 (FIG. 11), Va15) are performed. After that, in Step S25, it is determined that the potentials necessary for reading the multilevel memory have been obtained.

In Step S26, whether or not the multilevel memory can normally be read is determined. In the case where the multilevel memory can normally be read, operation is terminated, while in the case where the multilevel memory cannot normally be read, the operation goes to Step S21. In this embodiment, four kinds of potentials Va3, Va1, Va11, and Va15 are respectively held in the potential holding units 116_1 to 116_4, and these four kinds of potentials are used for reading of the multilevel memory that stores 2-bit data. Thus, the operation is terminated.

The structure described in this embodiment can be used in appropriate combination with the structures described in the other embodiments.

Embodiment 4

Figure 12:
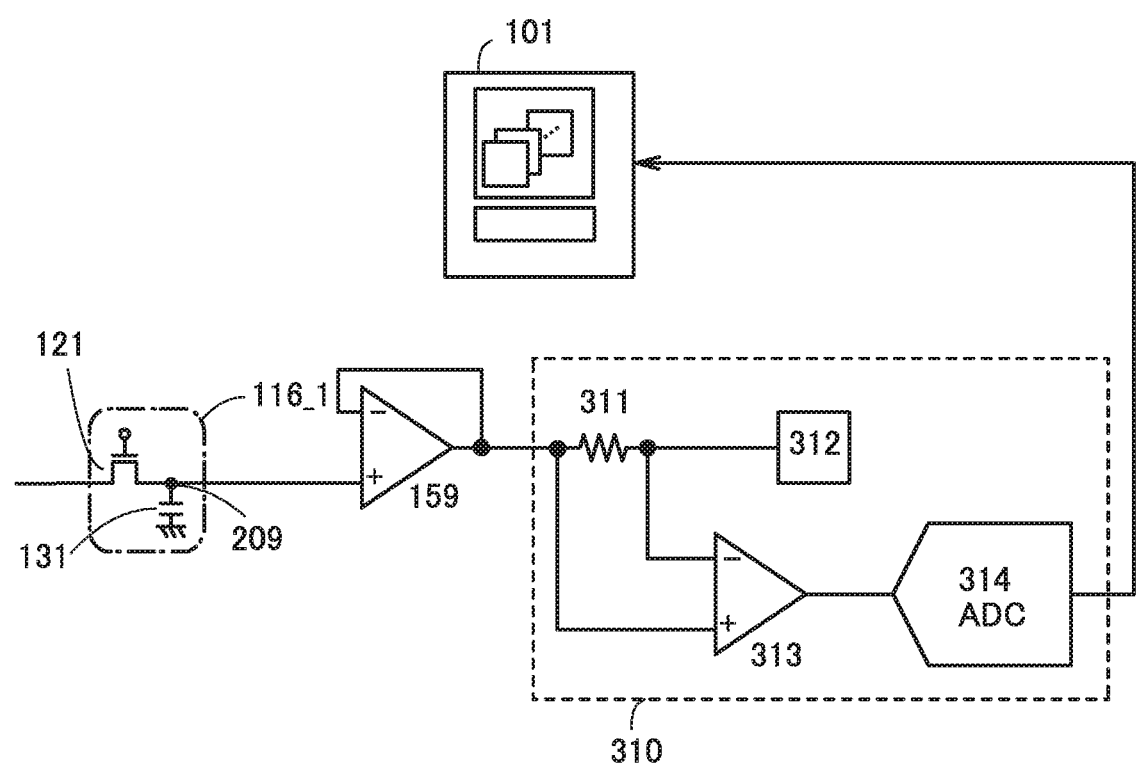
FIG. 12 A diagram illustrating a configuration of a semiconductor device of one embodiment of the present invention.

In this embodiment, the case where a monitor circuit is connected to the potential holding unit will be described with reference to FIG. 12. Although FIG. 12 illustrates only the potential holding unit 116_1 in the first column, a monitor circuit can also be connected to the potential holding units 116_2 to 116_n in the second row to the n-th row.

A monitor circuit 310 includes a resistor 311, a load 312, a voltage follower 313, and an ADC (Analog to Digital Converter) 314. The resistor 311 is an element with a minute resistance.

The node 209 of the potential holding unit 116_1 is connected to the resistor 311 via the voltage follower 159. The resistor 311 is connected to the load 312. The potential difference between the ends of the resistor 311 is amplified by the voltage follower 313, and the amplified data is supplied to the ADC 314. The ADC 314 converts the output data of the voltage follower 313 into digital data, and supplies the digital data to the control circuit 101. The data supplied to the control circuit 101 contains data on the amount of current flowing through the resistor 311. The control circuit 101 resets the potential of the node 209 of the potential holding unit 116_1 in the case where it determines that the resetting is necessary, in accordance with the digital data supplied from the ADC 314. The case where it determines the resetting is necessary corresponds to the case where the amount of current flowing through the resistor 311 exceeds the standard.

Providing the monitor circuit can prevent damage to or breakage of the potential holding unit.

The structure described in this embodiment can be used in appropriate combination with the structures described in the other embodiments.

Embodiment 5

<Configuration Examples of Multilevel Memory>

Configuration examples of the multilevel memory will be described with reference to FIGS. 13A-13F.

Figure 13A:
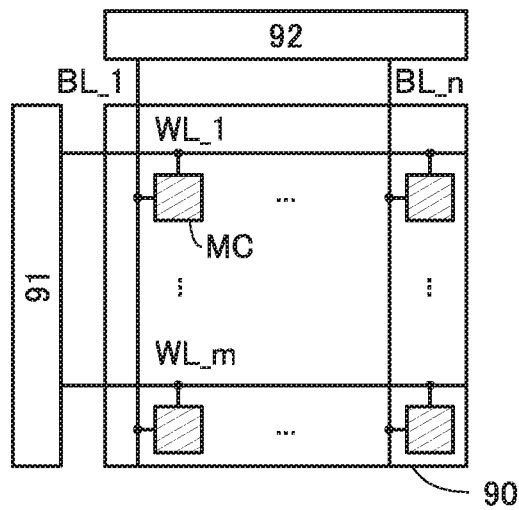
FIGS. 13A-13F Diagrams each illustrating a configuration of a semiconductor device of one embodiment of the present invention.

FIG. 13A is a block diagram for illustrating a configuration example of the multilevel memory. The block diagram shown in FIG. 13A illustrates a memory cell array 90, a word line driver circuit 91, and a bit line driver circuit 92.

The memory cell array 90 includes memory cells MC provided in a matrix of m rows and n columns (m and n are each a natural number). The memory cells MC are connected to word lines WL_1 to WL_m and bit lines BL_1 to BL_n. The memory cells MC may be connected to a source line for supplying current, a wiring for applying voltage to a back gate of a transistor, a capacitor line for fixing a potential of one electrode of a capacitor, or the like, in addition to the bit lines and the word lines.

The word line driver circuit 91 is a circuit that outputs a signal for selecting the memory cells MC in each row. Word lines for data writing and word lines for data reading may be provided separately as the word lines WL_1 to WL_m.

The bit line driver circuit 92 is a circuit for writing data into the memory cell MC in each column, or for reading out data from the memory cells MC. Bit lines for data writing and bit lines for data reading may be provided separately as the bit lines BL_1 to BL_n.

FIGS. 13B to 13F each illustrate an example of a circuit configuration that can be employed for the memory cell MC illustrated in FIG. 13A.

Figure 13B:
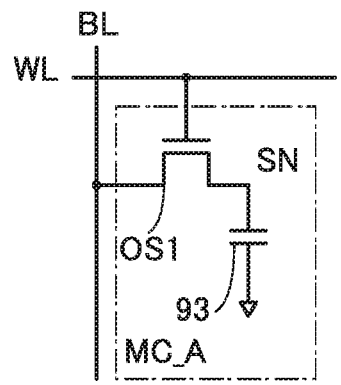

A memory cell MC_A illustrated in FIG. 13B includes a transistor OS1 and a capacitor 93. The transistor OS1 is an OS transistor. An OS transistor has a feature of an extremely low off-state current. Therefore, turning off the transistor OS1 allows a charge retention node SN to retain charge in accordance with data, and thus can reduce the refresh rate of the data stored in the charge retention node SN.

Figure 13C:
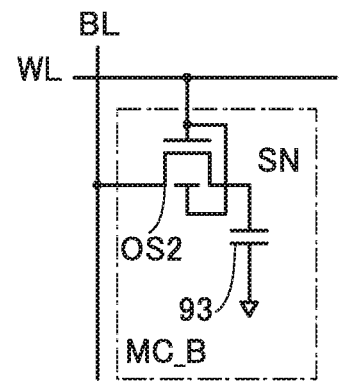

A memory cell MC_B illustrated in FIG. 13C includes a transistor OS2 and the capacitor 93. The transistor OS2 is an OS transistor. The transistor OS2 differs from the transistor OS1 in FIG. 13B in that a gate and a back gate are electrically connected to each other and the voltage of the word line WL is applied from both the gate and the back gate. Adopting such a structure can increase the amount of current flowing between a source and a drain when the transistor OS2 is turned on.

Figure 13D:
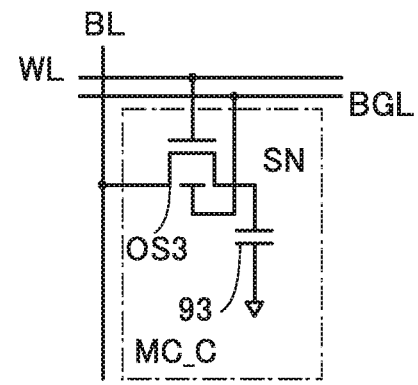

A memory cell MC_C illustrated in FIG. 13D includes a transistor OS3 and the capacitor 93. The transistor OS3 is an OS transistor. The transistor OS3 differs from the transistor OS1 in FIG. 13B in that a back gate and a back gate line BGL are electrically connected to each other and voltage different from that applied to a gate is applied to the back gate. Adopting such a structure enables control of the amount of current flowing between a source and a drain by control of the threshold voltage of the transistor OS3.

Figure 13E:
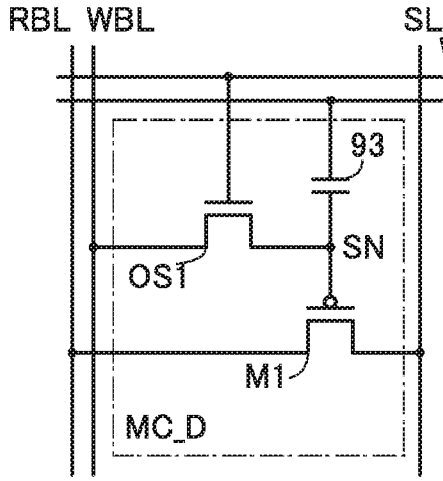

A memory cell MC_D illustrated in FIG. 13E includes the transistor OS1, a transistor M1, and the capacitor 93. One of a source and a drain of the transistor OS1 is connected to a write bit line WBL. The other of the source and the drain of the transistor OS1 is connected to a gate of the transistor M1 and one electrode of the capacitor 93. A gate of the transistor OS1 is connected to a write word line WWL. The other electrode of the capacitor 93 is connected to a read word line RWL. One of a source and a drain of the transistor M1 is connected to a read bit line RBL. The other of the source and the drain of the transistor M1 is connected to a source line SL. Although as the transistor M1, a p-channel transistor is illustrated, an n-channel transistor may be employed. Turning off the transistor OS1 allows the charge retention node SN to retain charge in accordance with data. The transistors M1 is a transistor with a channel formation region including silicon (Si transistor). Note that the transistor OS1 may have the same configuration as the transistor OS2 or OS3 described above.

Figure 13F:
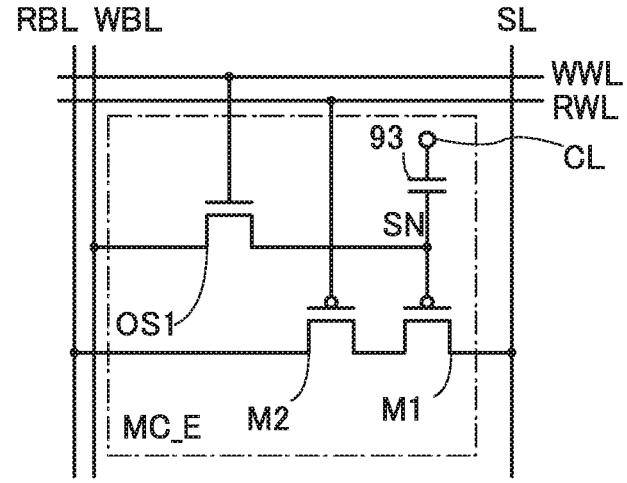

A memory cell MC_E illustrated in FIG. 13F includes the transistor OS1, the transistor M1, a transistor M2, and the capacitor 93. One of a source and a drain of the transistor OS1 is connected to the write bit line WBL. The other of the source and the drain of the transistor OS1 is connected to a gate of the transistor M1 and one electrode of the capacitor 93. A gate of the transistor OS1 is connected to the write word line WWL. The other electrode of the capacitor 93 is connected to the capacitor line CL. One of a source and a drain of the transistor M1 is connected to one of a source and a drain of the transistor M2. The other of the source and the drain of the transistor M1 is connected to the source line SL. A gate of the transistor M2 is connected to the read word line RWL. The other of the source and the drain of the transistor M2 is connected to the read bit line RBL. Although as the transistor M2, a p-channel transistor is illustrated, an n-channel transistor may be employed. Turning off the transistor OS1 allows the charge retention node SN to retain charge in accordance with data. The transistor M2 is a Si transistor. Note that the transistor OS1 may have the same structure as the transistor OS2 or OS3 described above.

<Fabrication Method Example of Electronic Component>

Figure 14A:
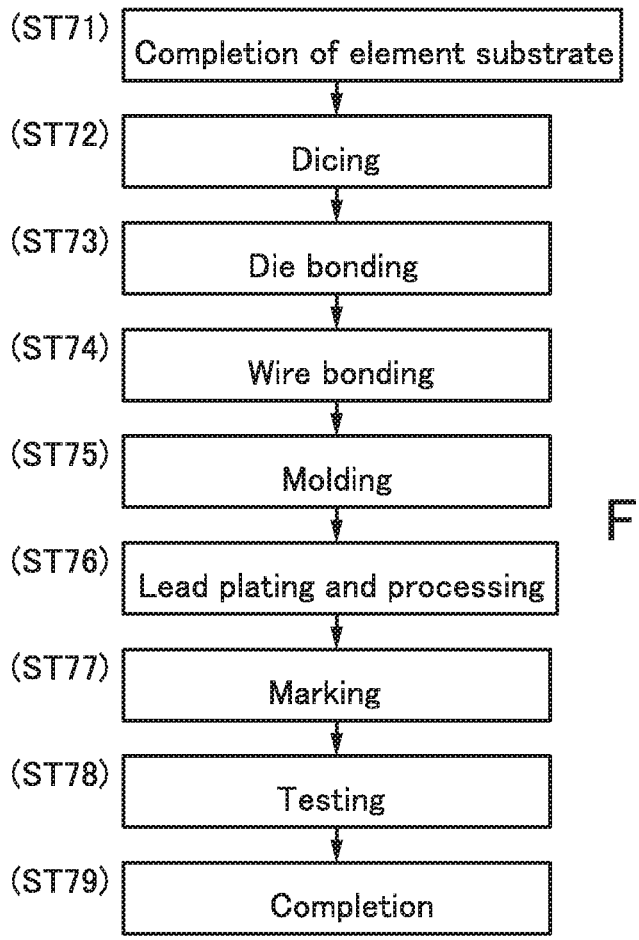
FIGS. 14A-14E Diagrams illustrating a structure of a semiconductor device of one embodiment of the present invention.

FIG. 14A is a flow chart showing an example of a method for fabricating an electronic component. The electronic component is also referred to as a semiconductor package or an IC package. This electronic component has a plurality of standards and names depending on a terminal extraction direction and a terminal shape. Thus, examples of the electronic component will be described in this embodiment.

A semiconductor device formed with a transistor is completed by integrating detachable components on a printed board through the assembly process (post-process). The post-process can be finished through the steps shown in FIG. 14A. Specifically, after an element substrate obtained in the pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 14B:
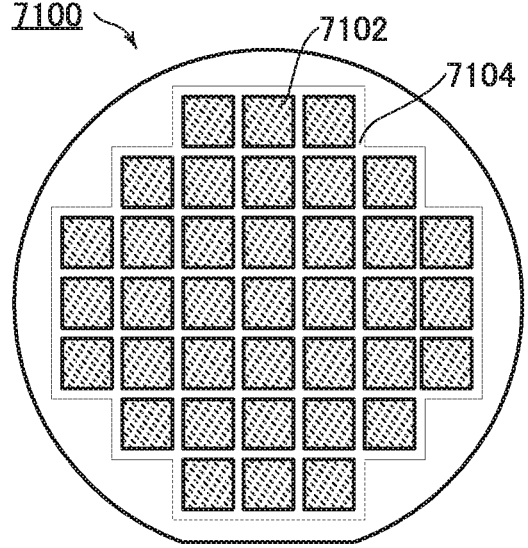
Figure 14C:
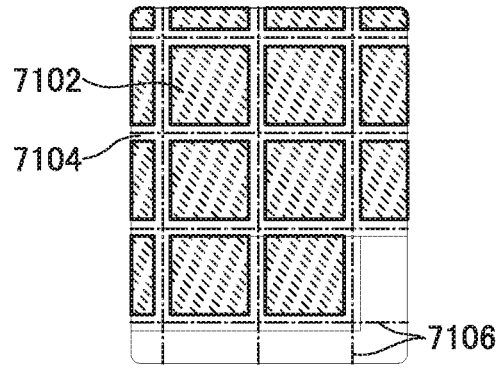

FIG. 14B is a top view of a semiconductor wafer 7100 before a dicing process. FIG. 14C is an enlarged view of part of FIG. 14B. A plurality of circuit regions 7102 are provided on the semiconductor wafer 7100. The circuit regions 7102 are provided with a semiconductor device of one embodiment of the present invention.

Figure 14D:
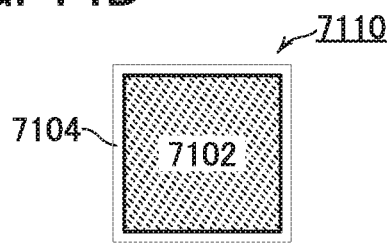

The plurality of circuit regions 7102 are each surrounded by a separation region 7104. Separation lines (also referred to as "dicing lines") 7106 are set at a position overlapping with the separation regions 7104. In the dicing step ST72, the semiconductor wafer 7100 is cut along the separation lines 7106, whereby chips 7110 including the circuit regions 7102 are cut out from the semiconductor wafer 7100. FIG. 14D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Furthermore, productivity of semiconductor devices can be increased.

After Step ST72, a die bonding step (Step ST73) is performed, where the divided chips are separately picked up, placed on a lead frame, and bonded thereto. As the method for bonding the chips and the lead frame in the die bonding step, a method suitable for the product is selected; for example, the chips and the lead frame may be bonded with a resin or tape. In the die bonding step, the chip may be mounted on an interposer and bonded thereto. In a wire bonding step, a lead of the lead frame and an electrode on the chip are electrically connected to each other with a metal fine line (wire) (Step ST74). A silver line or a gold line can be used as the metal fine line. The wire bonding may be either ball bonding or wedge bonding.

A wire-bonded chip is subjected to a molding step of sealing the chip with an epoxy resin or the like (Step ST75). By performing the molding step, the inside of the electronic component is filled with a resin, thereby reducing damage to the circuit portion and the wire embedded in the component caused by external mechanical force and reducing deterioration of characteristics due to moisture or dust. The lead of the lead frame is plated. After that, the lead is cut and processed (Step ST76). With the plating process, corrosion of the lead can be prevented, and soldering for mounting the electronic component on a printed circuit board in a later step can be performed with higher reliability. A printing process (marking) is performed on a surface of the package (Step ST77). After a testing step (Step ST78), the electronic component is completed (Step ST79). When an electronic component includes the semiconductor device of the above embodiment, the electronic component with low power consumption and a small size can be provided.

Figure 14E:
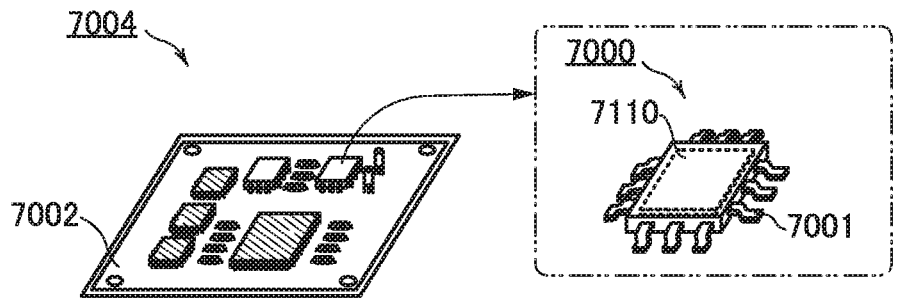

FIG. 14E shows a schematic perspective view of the completed electronic component. FIG. 14E shows a schematic perspective view of a QFP (Quad Flat Package) as an example of the electronic component. As illustrated in FIG. 11E, an electronic component 7000 includes a lead 7001 and a chip 7110.

The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used as an electronic component (IC chip) of electronic devices in a wide range of fields, such as digital signal processing, software-defined radio systems, avionics (electronic devices related to aviation, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), mobile phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

<Electronic Devices>

Then, the cases of using the above electronic component in electronic devices such as a computer, a portable information terminal (including a mobile phone, a portable game machine, an audio reproducing device, and the like), electronic paper, a television device (also referred to as a television or a television receiver), and a digital video camera will be described.

Figure 15A:
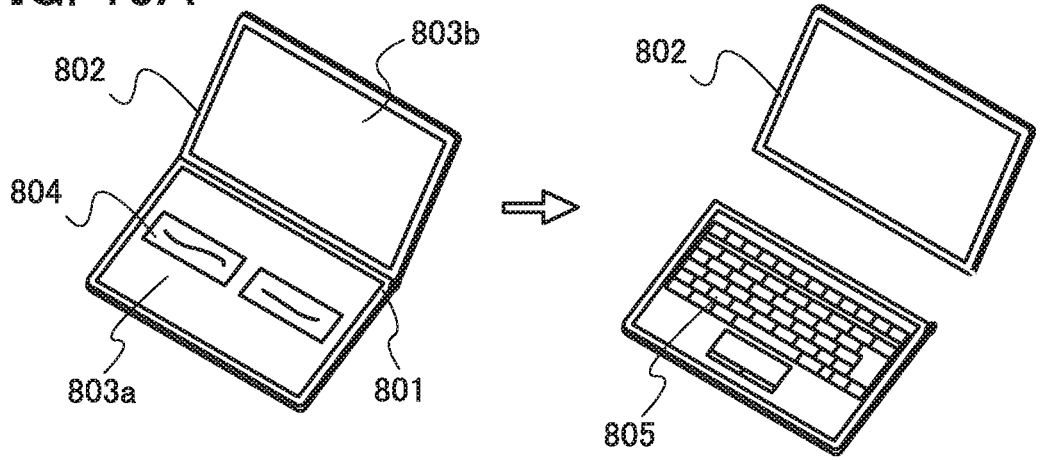
FIGS. 15A-15E Diagrams each illustrating a structure of a semiconductor device of one embodiment of the present invention.

FIG. 15A illustrates a portable information terminal and includes a housing 801, a housing 802, a first display portion 803a, a second display portion 803b, and the like. The semiconductor device described in the above embodiment is provided inside at least parts of the housing 801 and the housing 802. Thus, the portable information terminal which achieves a reduction in power consumption can be obtained.

Note that the first display portion 803a is a panel having a touch input function, and for example, as illustrated in the drawing on the left in FIG. 15A, which of "touch input" and "keyboard input" is performed can be selected by a selection button 804 displayed on the first display portion 803a. Because selection buttons with a variety of sizes can be displayed, people of any generation can realize good usability. For example, when "keyboard input" is selected, a keyboard 805 is displayed on the first display portion 803a as illustrated in the drawing on the right in FIG. 15A. This allows quick input of letters by keyboard input as in the case of using a conventional information terminal, for example.

One of the first display portion 803a and the second display portion 803b can be detached from the portable information terminal illustrated in FIG. 15A as illustrated in the drawing on the right in FIG. 15A. Providing the second display portion 803b with a touch input function makes the information terminal convenient to carry because the weight can be further reduced and to operate with one hand while the other hand supports the housing 802.

The portable information terminal illustrated in FIG. 15A can have a function of displaying various kinds of data (e.g., a still image, a moving image, and a text image), a function of displaying a calendar, a date, the time, or the like on the display portion, a function of operating or editing data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 15A may have a structure that allows wireless data transmission and reception. Through wireless communication, desired book data or the like can be purchased and downloaded from an electronic book server.

Furthermore, the housing 802 illustrated in FIG. 15A may be equipped with an antenna, a microphone function, or a wireless communication function to be used as a mobile phone.

Figure 15B:
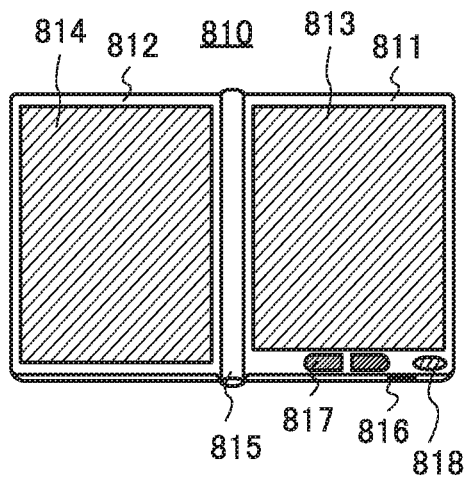

FIG. 15B is an e-book reader 810 in which electronic paper is incorporated, and the e-book reader includes two housings of a housing 811 and a housing 812. The housing 811 and the housing 812 are provided with a display portion 813 and a display portion 814, respectively. The housing 811 and the housing 812 are connected by a hinge portion 815 and can be opened or closed with the hinge portion 815 as an axis. The housing 811 is provided with a power switch 816, an operation key 817, a speaker 818, and the like. At least one of the housing 811 and the housing 812 is provided with the semiconductor device described in the above embodiment. This allows the e-book reader to have lower power consumption.

Figure 15C:
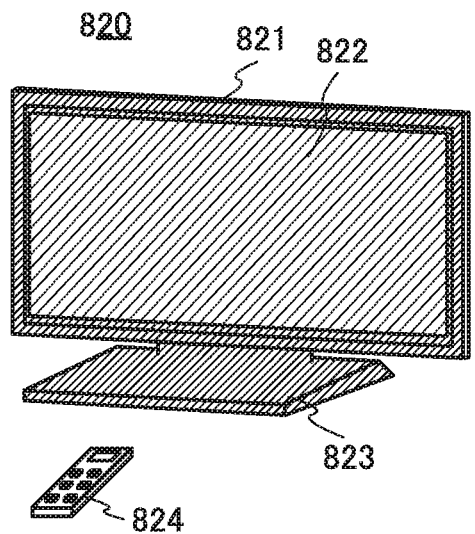

FIG. 15C is a television device including a housing 821, a display portion 822, a stand 823, and the like. The television device 820 can be operated with a switch of the housing 821 and a remote controller 824. The semiconductor device described in the above embodiment is provided in the housing 821 and the remote controller 824. Thus, the television device which achieves a reduction in power consumption can be obtained.

Figure 15D:
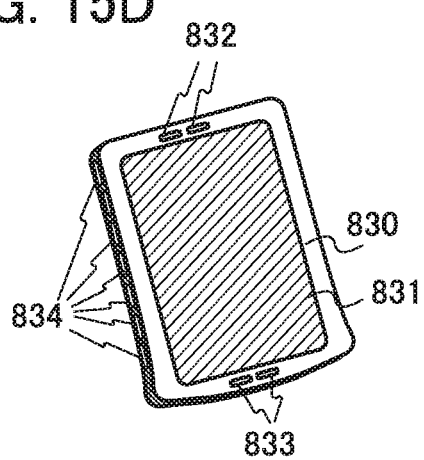

FIG. 15D is a smartphone in which a main body 830 is provided with a display portion 831, a speaker 832, a microphone 833, operation keys 834, and the like. The semiconductor device described in the above embodiment is provided in the main body 830. This allows the smartphone to be less likely to malfunction and to have lower power consumption.

Figure 15E:
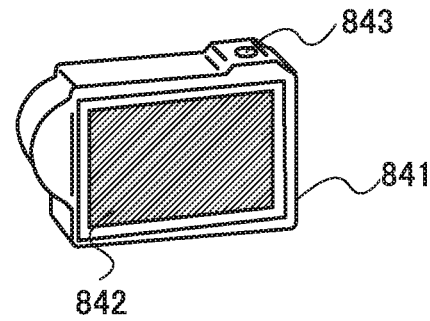

FIG. 15E is a digital camera including a main body 841, a display portion 842, an operation switch 843, and the like. The semiconductor device described in the above embodiment is provided in the main body 841. Thus, the digital camera which achieves lower power consumption can be obtained.

As described above, in the electronic devices described in this embodiment, the semiconductor device of the above embodiment is provided. Thus, the electronic devices which achieve reduction in power consumption can be obtained.

The structure described in this embodiment can be used in appropriate combination with the structures described in the other embodiments.

REFERENCE NUMERALS

100: power supply circuit, 101: control circuit, 102_m: scan chain circuit, 102_1: scan chain circuit 102, 102_2: scan chain circuit, 102_3: scan chain circuit, 102_4: scan chain circuit, 105: selection circuit, 105m: switch, 105_1: switch, 105_2: switch, 105_3: switch, 105_4: switch, 108_N: flip-flop circuit, 108_0: flip-flop circuit, 110: DAC, 111: potential generating circuit, 112: selection circuit, 113: resistor, 114: selector, 115a: wiring, 115b: wiring, 116_n: potential holding unit, 116_1: potential holding unit, 116_2: potential holding unit, 116_3: potential holding unit, 116_4: potential holding unit, 120: potential holding circuit, 121: transistor, 122: transistor, 123: transistor, 131: capacitor, 140: buffer, 141: amplifier, 151: operational amplifier, 152: source follower circuit, 153: n-channel transistor, 154: n-channel transistor, 155: terminal, 156: comparator, 159: voltage follower

The invention claimed is:

1. A semiconductor device comprising:
a control circuit comprising a plurality of scan chain circuits;
a DA converter electrically connected to the control circuit;
a plurality of potential holding units electrically connected to the DA converter; and
a memory electrically connected to the plurality of potential holding units,
wherein each of the plurality of potential holding units comprises a transistor and a capacitor electrically connected to the transistor,
wherein a channel formation region of the transistor comprises an oxide semiconductor, wherein an output potential output from the DA converter is held in one of the plurality of potential holding units, in accordance with digital data held in one of the plurality of scan chain circuits, wherein the one of the plurality of potential holing circuits supplies an analog data to the memory, and wherein the output potential output from the DA converter is held in a node where one of a source and a drain of the transistor is electrically connected to one electrode of the capacitor in the one of the plurality of potential holding units.

2. The semiconductor device according to claim 1, wherein each of the plurality of scan chain circuits comprises a flip-flop circuit.

3. The semiconductor device according to claim 1, wherein the other of the source and the drain of the transistor is electrically connected to the DA converter.

4. The semiconductor device according to claim 1, wherein the transistor comprises a gate electrode and a back gate electrode.

5. The semiconductor device according to claim 1, further comprising a monitor circuit, wherein the monitor circuit supplies to the control circuit data on an amount of current flowing through a resistor.

6. An electronic device comprising the semiconductor device according to claim 1.

7. The semiconductor device according to claim 1, wherein the memory stores a plurality bits of data.

8. A semiconductor device comprising:
a control circuit comprising a plurality of scan chain circuits;
a DA converter electrically connected to the control circuit;
a plurality of potential holding units electrically connected to the DA converter; and
a memory electrically connected to the plurality of potential holding units, wherein each of the plurality of potential holding units comprises a transistor and a capacitor electrically connected to the transistor, wherein a channel formation region of the transistor comprises an oxide semiconductor, wherein an output potential output from the DA converter is held in one of the plurality of potential holding units, in accordance with digital data held in one of the plurality of scan chain circuits, and wherein the one of the plurality of potential holing circuits supplies an analog data to the memory.

9. The semiconductor device according to claim 8, wherein each of the plurality of scan chain circuits comprises a flip-flop circuit.

10. The semiconductor device according to claim 8,
wherein one of a source and a drain of the transistor is electrically connected to one electrode of the capacitor, and
wherein the other of the source and the drain of the transistor is electrically connected to the DA converter.

11. The semiconductor device according to claim 8, wherein the transistor comprises a gate electrode and a back gate electrode.

12. The semiconductor device according to claim 8, further comprising a monitor circuit, wherein the monitor circuit supplies to the control circuit data on an amount of current flowing through a resistor.

13. An electronic device comprising the semiconductor device according to claim 8.

14. The semiconductor device according to claim 8, wherein the memory stores a plurality bits of data.

* * * * *